United States Patent
Choi et al.

(10) Patent No.: US 8,742,591 B2
(45) Date of Patent: Jun. 3, 2014

(54) SEMICONDUCTOR DEVICE AND METHOD OF FORMING INSULATING LAYER IN NOTCHES AROUND CONDUCTIVE TSV FOR STRESS RELIEF

(75) Inventors: Won Kyoung Choi, Singapore (SG); Chang Bum Yong, Singapore (SG); Jae Hun Ku, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 223 days.

(21) Appl. No.: 13/333,395

(22) Filed: Dec. 21, 2011

(65) Prior Publication Data

US 2013/0161824 A1 Jun. 27, 2013

(51) Int. Cl.
*H01L 23/48* (2006.01)
*H01L 21/44* (2006.01)

(52) U.S. Cl.
USPC .......... 257/774; 257/622; 257/E23.145; 257/E21.577; 438/667; 438/978

(58) Field of Classification Search
USPC .......... 257/774, 622, E23.145, E21.577
See application file for complete search history.

(56) References Cited

U.S. PATENT DOCUMENTS

| | | | |
|---|---|---|---|
| 6,498,381 B2 | 12/2002 | Halahan et al. | |
| 6,809,421 B1 | 10/2004 | Hayasaka et al. | |
| 6,812,549 B2 * | 11/2004 | Umetsu et al. | 257/621 |
| 6,916,725 B2 * | 7/2005 | Yamaguchi | 438/459 |
| 7,214,615 B2 * | 5/2007 | Miyazawa | 438/667 |
| 7,358,602 B2 * | 4/2008 | Hara | 257/689 |
| 7,795,140 B2 | 9/2010 | Taguchi et al. | |
| 2004/0061238 A1 * | 4/2004 | Sekine | 257/774 |
| 2006/0148250 A1 * | 7/2006 | Kirby | 438/667 |
| 2006/0205211 A1 | 9/2006 | Kirby | |
| 2010/0038800 A1 | 2/2010 | Yoon et al. | |
| 2010/0127345 A1 * | 5/2010 | Sanders et al. | 257/528 |
| 2011/0133333 A1 * | 6/2011 | Kwon et al. | 257/737 |

* cited by examiner

*Primary Examiner* — Nitin Parekh
(74) *Attorney, Agent, or Firm* — Robert D. Atkins; Patent Law Group: Atkins & Associates, P.C.

(57) ABSTRACT

A semiconductor device has a plurality of conductive vias formed into a semiconductor wafer. A portion of the semiconductor wafer is removed so the conductive vias extend above a surface of the semiconductor wafer. A notch is formed in the semiconductor wafer around each of the conductive vias. The notch around the conductive vias can be formed by wet etching, dry etching, or LDA. A first insulating layer is formed over a surface of the semiconductor wafer and conductive vias and into the notch to provide stress relief between the conductive vias and semiconductor wafer. A portion of the first insulating layer is removed to expose the conductive vias. A first conductive layer and second insulating layer can be formed around the conductive vias. A second conductive layer can be formed over the conductive vias. The notch can extend into the second insulating layer.

22 Claims, 12 Drawing Sheets

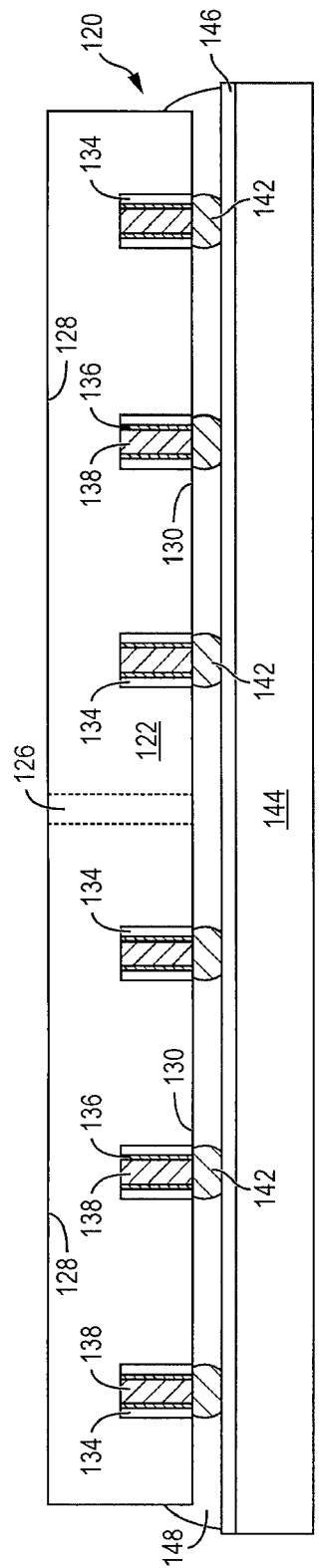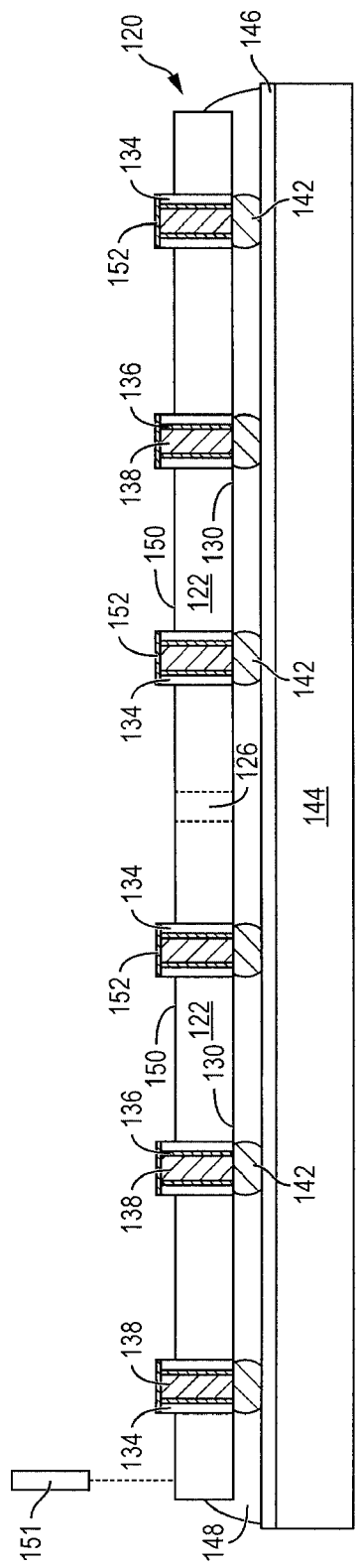
FIG. 3i
FIG. 3j

SEMICONDUCTOR DEVICE AND METHOD OF FORMING INSULATING LAYER IN NOTCHES AROUND CONDUCTIVE TSV FOR STRESS RELIEF

FIELD OF THE INVENTION

The present invention relates in general to semiconductor devices and, more particularly, to a semiconductor device and method of forming an insulating layer in notches around conductive TSV for stress relief.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor wafer may contain conductive through silicon vias (TSV). A plurality of vias is formed through the semiconductor wafer. The vias are filled with conductive material to form the conductive TSV. The conductive TSV are susceptible to stress due to mismatches in the coefficient of thermal expansion (CTE), particular at the junction between the conductive TSV and base material of the semiconductor wafer. The stress can cause cracking, degraded electrical performance, and other defects in the semiconductor wafer.

SUMMARY OF THE INVENTION

A need exists to reduce stress between conductive TSV and the base material of the semiconductor wafer. Accordingly, in one embodiment, the present invention is a method of making a semiconductor device comprising the steps of providing a semiconductor wafer, forming a plurality of conductive vias into the semiconductor wafer, removing a first portion of the semiconductor wafer so the conductive vias extend above a surface of the semiconductor wafer, forming a notch in the semiconductor wafer around each of the conductive vias, forming an insulating layer over the surface of the semiconductor wafer and conductive vias and into the notch to provide stress relief between the conductive vias and semiconductor wafer, and removing a portion of the insulating layer to expose the conductive vias.

In another embodiment, the present invention is a method of making a semiconductor device comprising the steps of providing a semiconductor die having a conductive via formed through the semiconductor die, forming a notch in the semiconductor die around the conductive via, forming an insulating layer over a surface of the semiconductor die and conductive via and into the notch, and removing a portion of the insulating layer to expose the conductive via.

In another embodiment, the present invention is a method of making a semiconductor device comprising the steps of providing a semiconductor die having a conductive via formed through the semiconductor die, forming a notch in the semiconductor die around the conductive via, and forming an insulating layer over a surface of the semiconductor die and conductive via and into the notch.

In another embodiment, the present invention is a semiconductor device comprising a semiconductor die having a conductive via formed through the semiconductor die. A notch is formed in the semiconductor die around the conductive via. An insulating layer is formed over a surface of the semiconductor die and into the notch.

DETAILED DESCRIPTION OF THE DRAWINGS

Figure 1:
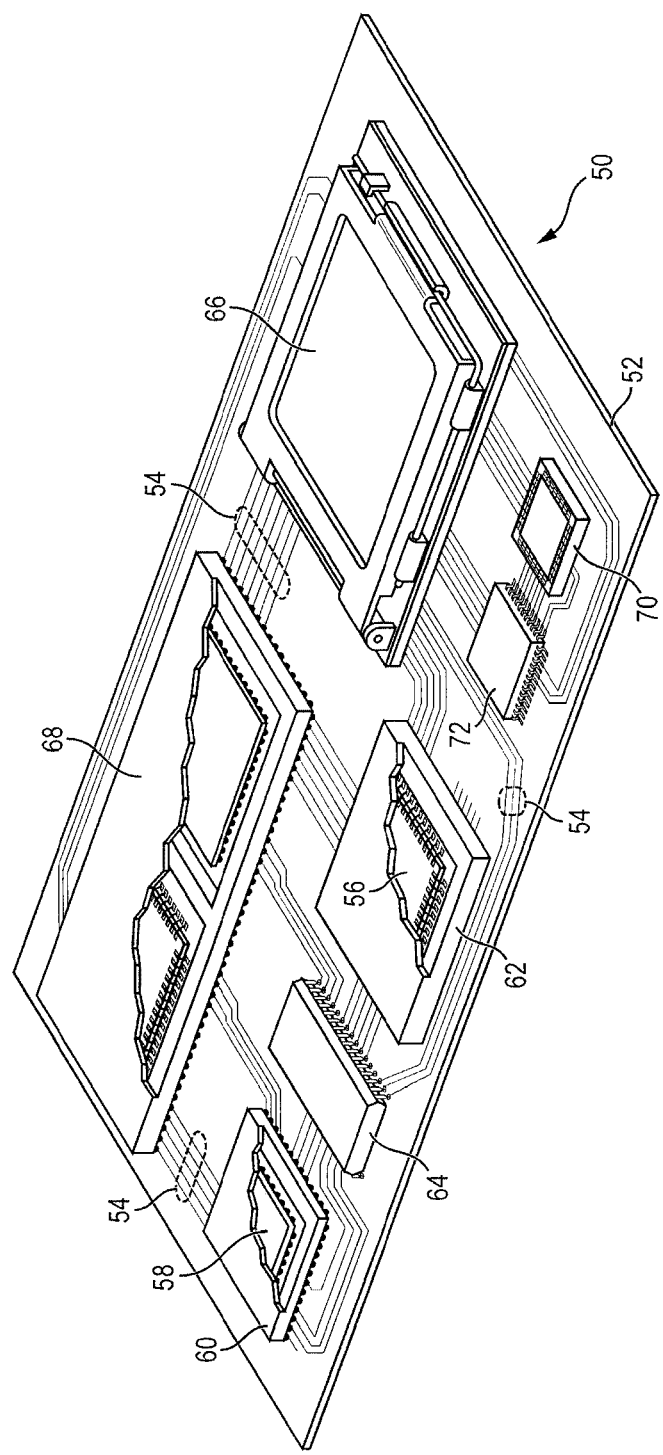
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer.

Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
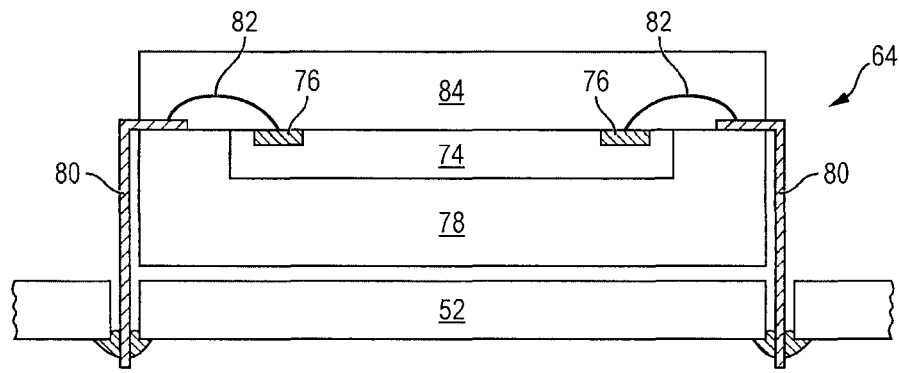
FIGS. 2a-2c illustrate further detail of the representative semiconductor packages mounted to the PCB.
Figure 2B:
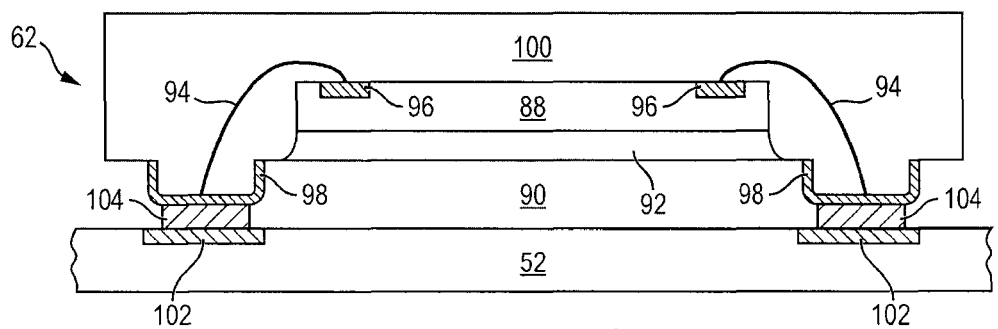
Figure 2C:
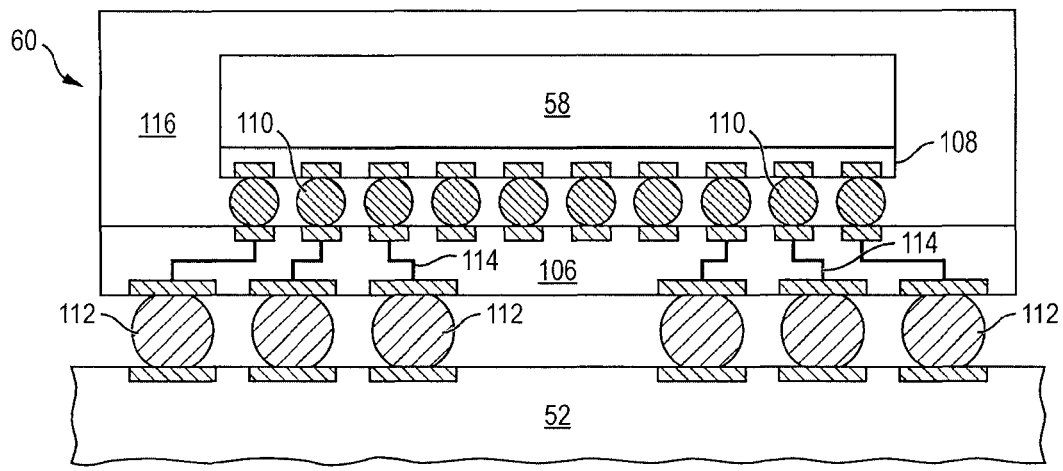

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
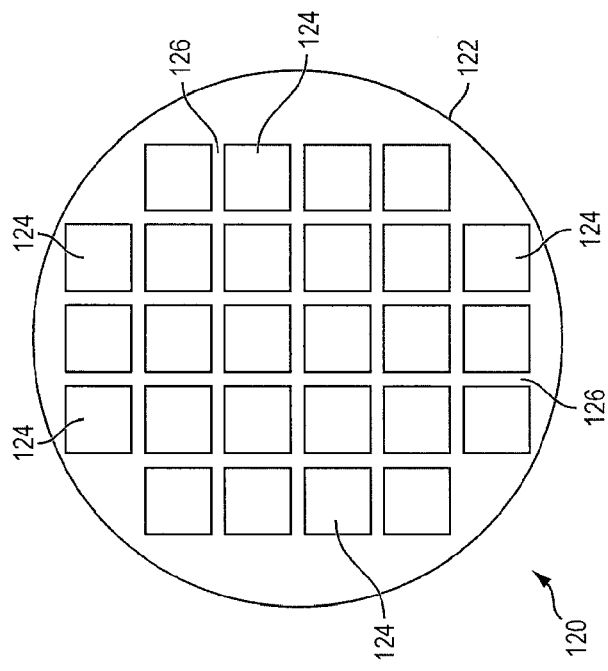
FIGS. 3a-3o illustrate a process of forming an insulating layer in notches around conductive TSV for stress relief.
Figure 3B:
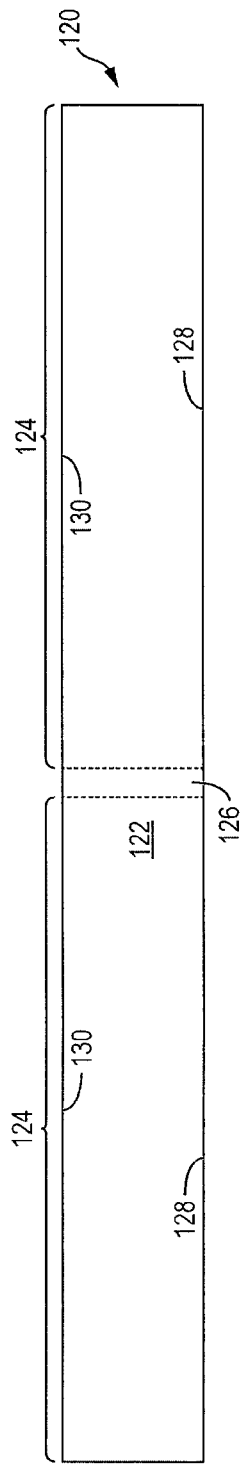
Figure 3C:
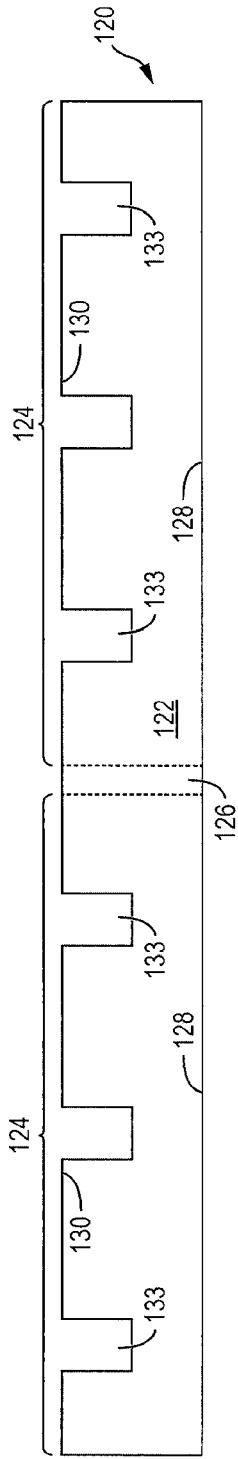
Figure 3D:
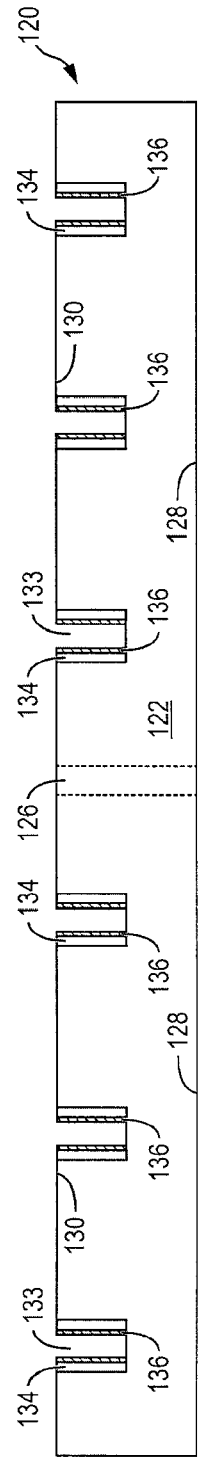
Figure 3E:
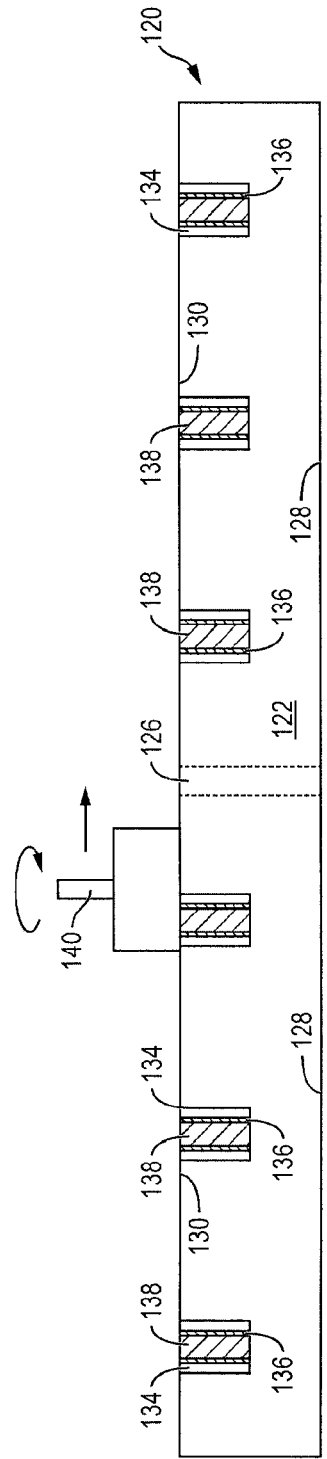
Figure 3F:
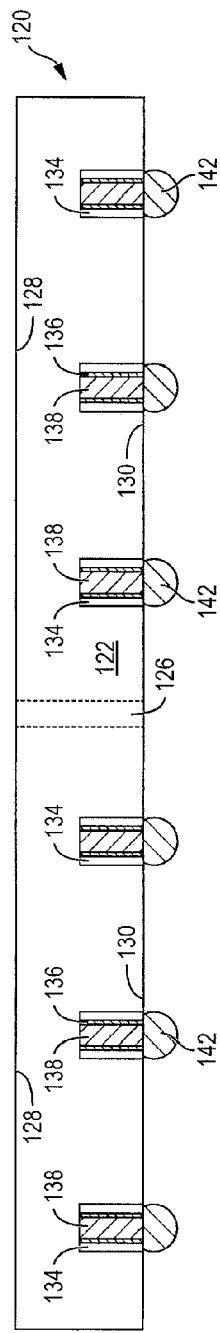
Figure 3G:
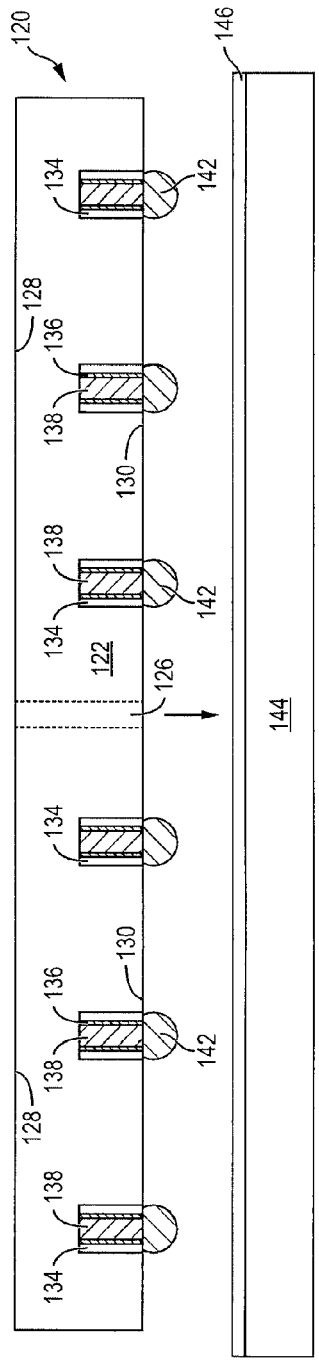
Figure 3H:
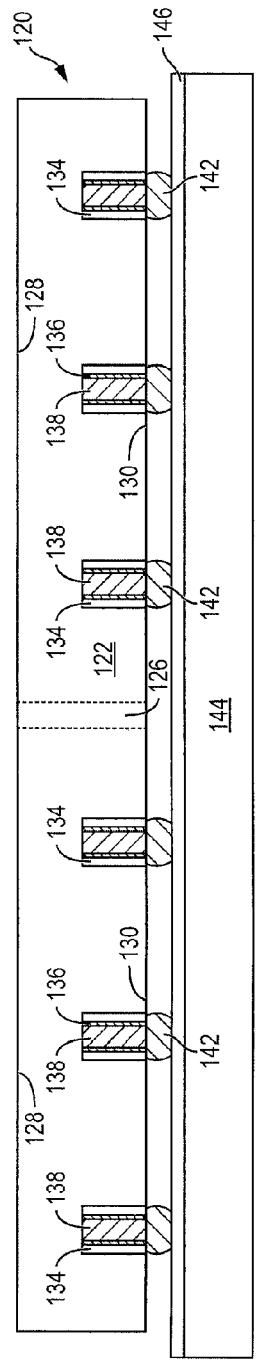
Figure 3K:
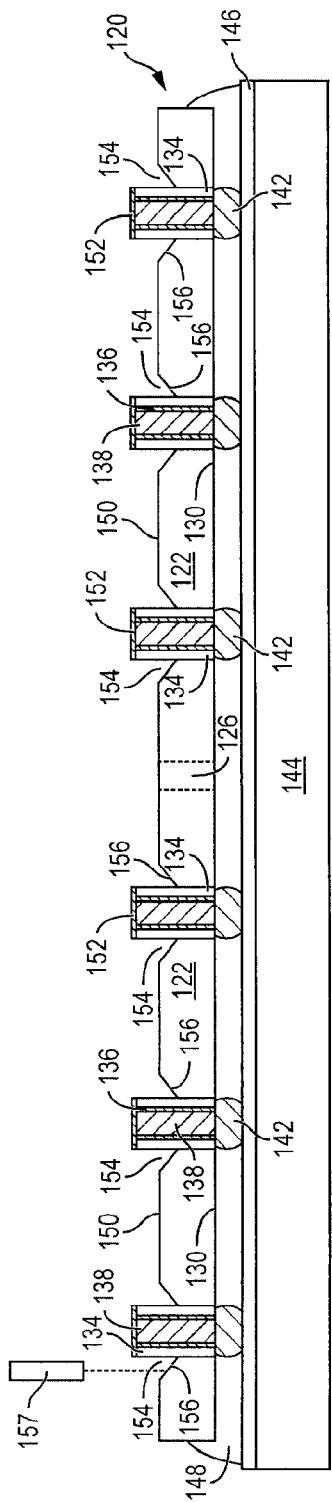
Figure 3L:
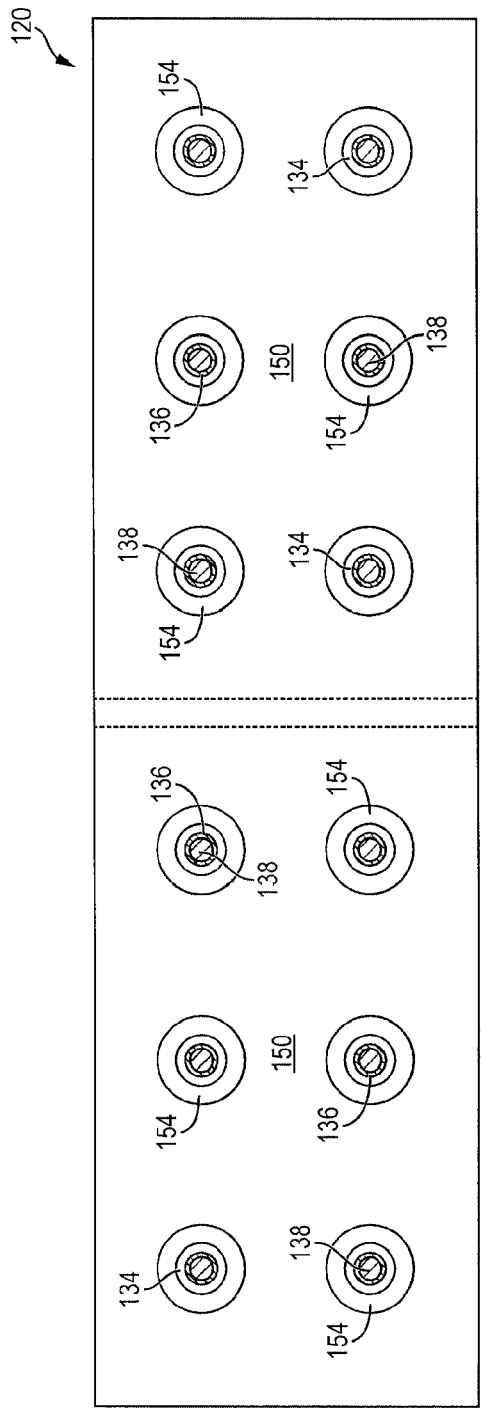
Figure 3M:
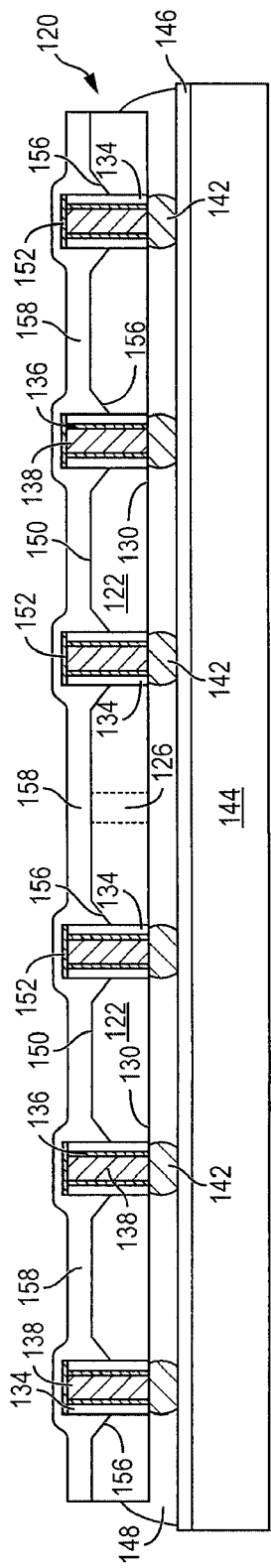
Figure 3N:
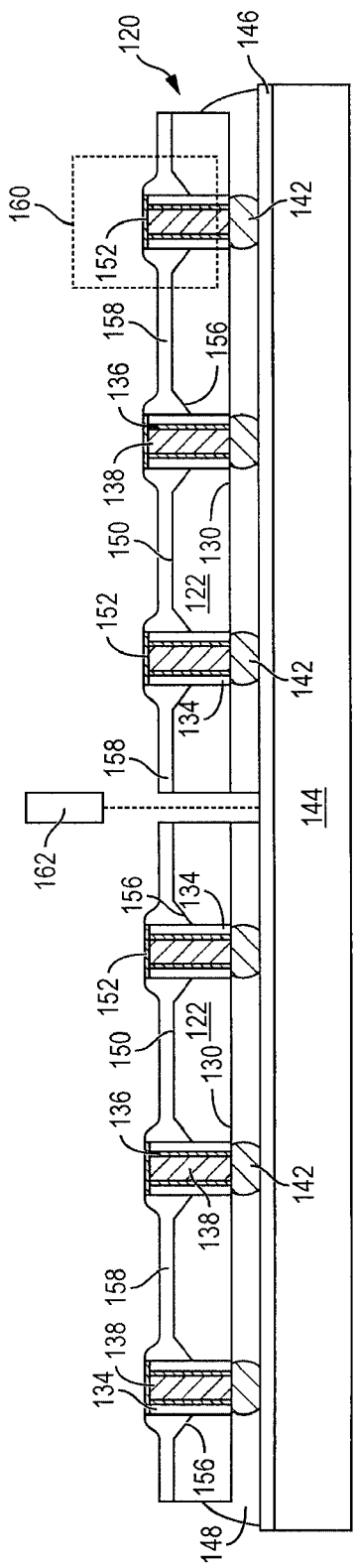
Figure 3O:
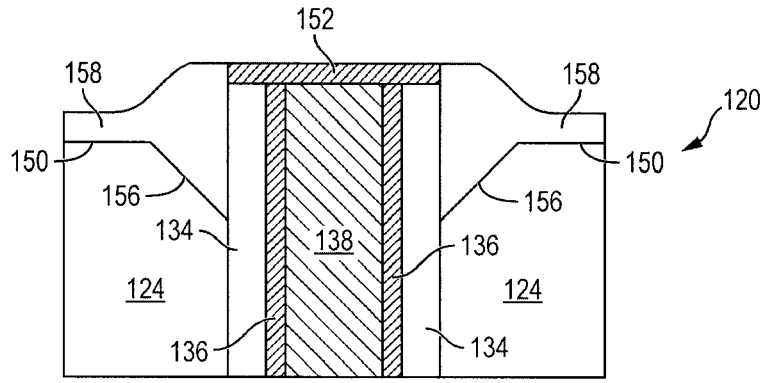

FIGS. 3a-3o illustrate, in relation to FIGS. 1 and 2a-2c, a process of forming an insulating layer in notches around conductive TSV for stress relief. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

In FIG. 3c, a plurality of blind vias 133 is formed into active surface 130 and partially but not completely through semiconductor wafer 120 using mechanical drilling, laser drilling, or deep reactive ion etching (DRIE).

In FIG. 3d, an insulating or dielectric layer 134 is formed over sidewalls of vias 133 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other suitable dielectric material.

An electrically conductive layer 136 is formed over insulating layer 134 within vias 133 using a patterning and metal deposition process such as printing, PVD, CVD, sputtering, electrolytic plating, and electroless plating. Conductive layer 136 can be one or more layers of Ni, tantalum nitride (TaN), nickel vanadium (NiV), platinum (Pt), palladium (Pd), chromium copper (CrCu), or other suitable barrier material.

In FIG. 3e, blind vias 133 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive TSV 138 lined with insulating layer 134 and conductive layer 136 and embedded within semiconductor wafer 120. In one embodiment, conductive layer 136 operates as a barrier layer to inhibit diffusion of conductive TSV 138, e.g. Cu, into insulating layer 134 and base substrate material 122. Conductive TSV 138 are electrically connected to the circuits on active surface 130. A portion of active surface 130 of semiconductor die 124 is optionally removed by grinder 140 or CMP to planarize the surface and expose conductive TSV 138.

In FIG. 3f, an electrically conductive bump material is deposited over conductive TSV 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 138 using a suitable attachment or bonding process. In one embodiment, the bump material is reflowed by heating the material above its melting point to form spherical balls or bumps 142. In some applications, bumps 142 are reflowed a second time to improve electrical contact to conductive TSV 138. An optional under bump metallization (UBM) layer can be disposed between bumps 142 and conductive TSV 138. Bumps 142 can also be compression bonded to conductive TSV 138. Bumps 142 represent one type of interconnect structure that can be formed over conductive TSV 138. The interconnect structure can also use stud bump, micro bump, or other electrical interconnect.

FIG. 3g shows a temporary substrate or carrier 144 containing sacrificial base material such as silicon, polymer, beryllium oxide, glass, or other suitable low-cost, rigid material for structural support. An interface layer or double-sided tape 146 is formed over carrier 144 as a temporary adhesive bonding film, etch-stop layer, or thermal release layer. Semiconductor wafer 120 is inverted, positioned over, and mounted to interface layer 146 over carrier 144 with active surface 130 and bumps 142 oriented toward the carrier. FIG. 3h shows semiconductor wafer 120 mounted to interface layer 146 over carrier 144.

Semiconductor wafer 120 and carrier 144 are placed in a chase mold. A mold underfill (MUF) material 148 in a liquid state is injected into the chase mold between semiconductor wafer 120 and carrier 144. MUF material 148 can be an encapsulant, molding compound, or polymer composite material, such as epoxy resin with filler, epoxy acrylate with filler, or polymer with proper filler. MUF material 148 is cured. FIG. 3i shows MUF material 148 disposed between semiconductor wafer 120 and carrier 144.

In FIG. 3j, a portion of back surface 128 is removed by a combination of backgrinding, CMP, and/or etching processes to expose conductive TSV 138 above surface 150 of semiconductor wafer 120. Alternatively, a portion of back surface 128 is removed by laser direct ablation (LDA) using laser 151 so that conductive TSV 138 extends above surface 150 of semiconductor wafer 120.

An electrically conductive layer 152 is formed over insulating layer 134, conductive layer 136, and conductive TSV 138 using a patterning and metal deposition process such as printing, PVD, CVD, sputtering, electrolytic plating, and electroless plating. Conductive layer 152 can be one or more layers of titanium tungsten (TiW), titanium copper (TiCu), titanium tungsten copper (TiWCu), tantalum nitrogen copper (TaNCu), or other suitable material. In one embodiment, conductive layer 152 operates as a seed layer for electrical interconnect to external devices. Conductive layer 152 can be formed prior to etching surface 128 so that conductive TSV 138 extends above surface 150.

In FIG. 3k, a plurality of grooves or notches 154 is formed in surface 150 of semiconductor wafer 120 around insulating layer 134, conductive layer 136, and conductive TSV 138 by removing a portion of base substrate material 122. In one embodiment, notches 154 can be formed by an angled isotropic dry etch using RF power to form sloped surface 156. In another embodiment, notches 154 can be formed by a wet etch using a masking layer having a linear gradient contrast portion. Surface 150 of semiconductor wafer 120 is exposed to ultraviolet (UV) light. The linear gradient contrast portion of the masking layer passes the UV light with linearly varying intensity. The masking layer is removed and surface 150 is subjected to an etching process. A portion of surface 150 is removed according to its linear gradient cured state leaving notches 154 with sloped surface 156. Alternatively, notches 154 are formed by LDA using laser 157. In particular, the intensity or duration of laser 157 is controlled to create notches 154 having linear sloped surface 156 in surface 150 of semiconductor wafer 120. FIG. 3l shows a plan view of notches 154 formed in surface 150 of semiconductor wafer 120 around insulating layer 134, conductive layer 136, and conductive TSV 138. Notches 154 can be rectangular or circular.

In FIG. 3m, an insulating or dielectric layer 158 is formed over surface 150 of semiconductor wafer 120, insulating layer 134, and conductive layer 152 and into notches 154 using PVD, CVD, printing, spin coating, spray coating, sintering or thermal oxidation. The insulating layer 158 contains one or more layers of SiO2, Si3N4, SiON, Ta2O5, Al2O3, HfO2, PI, BCB, PBO, or other material having similar dielectric properties.

In FIG. 3n, a portion of insulating layer 158 over conductive TSV 138 is removed by CMP or etching process to expose conductive layer 152. FIG. 3o shows further detail of insulating layer 158, insulating layer 134, conductive layer 136, and conductive TSV 138 in block 160 defined in FIG. 3n.

Semiconductor wafer 120 is singulated through insulating layer 158, saw street 126, and MUF material 148 using a saw blade or laser cutting tool 162 into individual semiconductor die 124. Carrier 144 and interface layer 146 are removed by chemical etching, mechanical peeling, CMP, mechanical grinding, thermal bake, UV light, laser scanning, or wet stripping to expose bumps 142.

Figure 4:
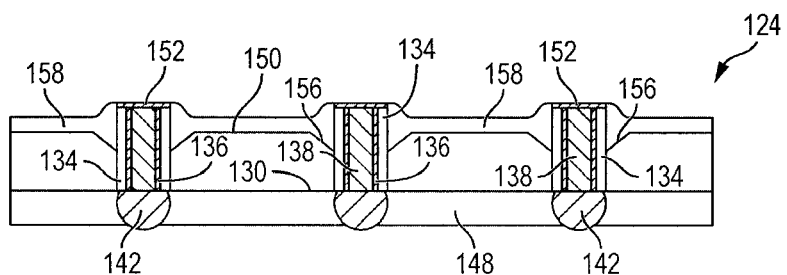
FIG. 4 illustrates a semiconductor die with an insulating layer formed in notches around conductive TSV for stress relief.

FIG. 4 shows semiconductor die 124 after singulation. The circuits on active surface 130 of semiconductor die 124 are electrically connected to conductive TSV 138 and bumps 142. Notches 154 are formed in surface 150 of semiconductor wafer 120. The insulating layer 158 is formed over surface 150 and conductive TSV 138 and into notches 154. The insulating layer 158 disposed in notches 154 provide stress relief as well as electrical isolation between conductive TSV 138 and semiconductor die 124 to reduce current leakage between the conductive TSV and semiconductor die.

Figure 5:
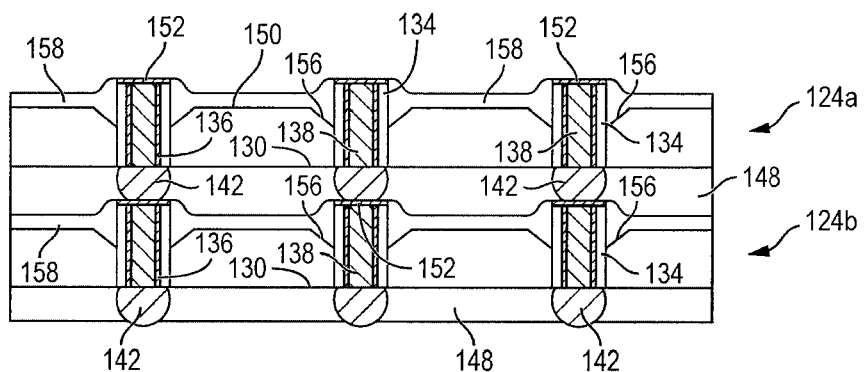
FIG. 5 illustrates two stacked semiconductor die with an insulating layer formed in notches around conductive TSV for stress relief.

FIG. 5 shows two stacked semiconductor die 124a-124b electrically connected through conductive TSV 138. The circuits on active surface 130 of semiconductor die 124a are electrically connected through conductive TSV 138 and bumps 142 to the circuits on active surface 130 of semiconductor die 124b. The insulating layer 158 disposed in notches 154 provide stress relief as well as electrical isolation between conductive TSV 138 and semiconductor die 124 to reduce current leakage between the conductive TSV and semiconductor die.

Figure 6A:
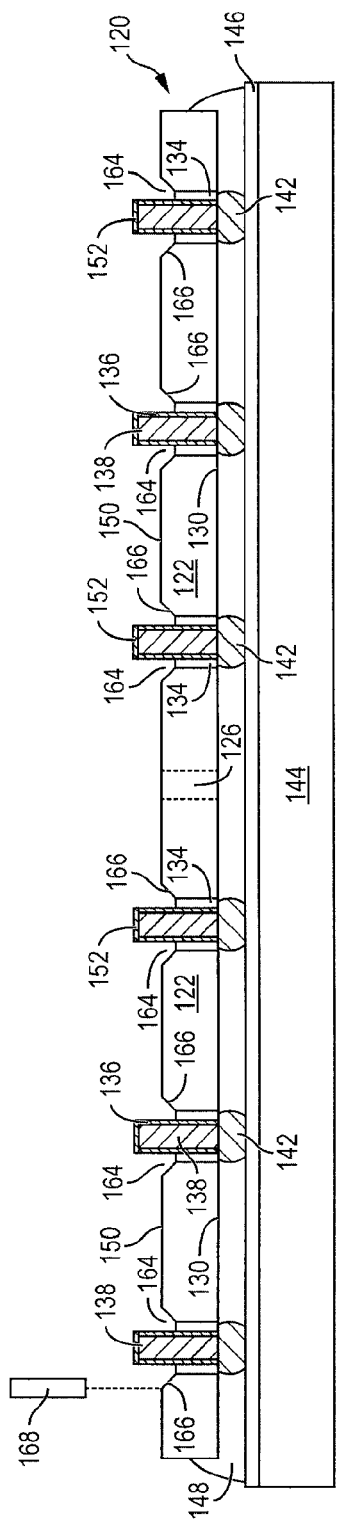
FIGS. 6a-6e illustrate another process of forming an insulating layer in notches around conductive TSV for stress relief.
Figure 6B:
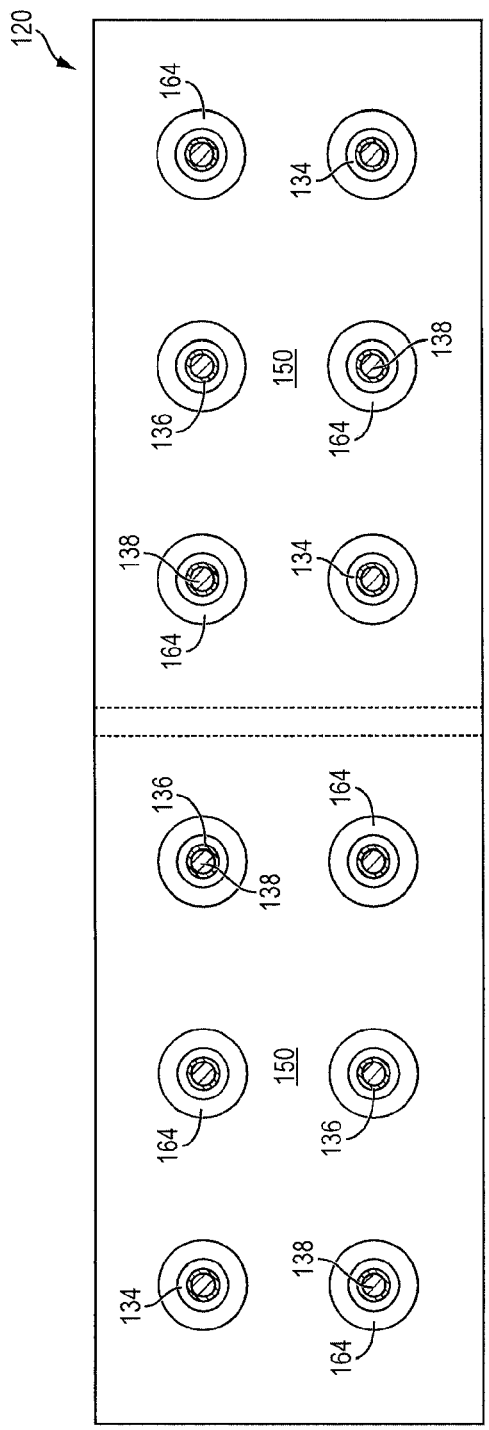

In another embodiment continuing from FIG. 3j, a plurality of grooves or notches 164 is formed in surface 150 of semiconductor wafer 120 around conductive TSV 138 by removing a portion of base substrate material 122 and insulating layer 134, as shown in FIG. 6a. In one embodiment, notches 164 can be formed by an angled isotropic dry etch using RF power to form sloped surface 166. In another embodiment, notches 164 can be formed by a wet etch using a masking layer having a linear gradient contrast portion. Surface 150 of semiconductor wafer 120 is exposed to UV light. The linear gradient contrast portion of the masking layer passes the UV light with linearly varying intensity. The masking layer is removed and surface 150 is subjected to an etching process. A portion of surface 150 is removed according to its linear gradient cured state leaving notches 164 with sloped surface 166. Notches 164 also remove a portion of insulating layer 134. Alternatively, notches 164 are formed by LDA using laser 168. In particular, the intensity or duration of laser 168 is controlled to create notches 164 having linear sloped surface 166 in surface 150 of semiconductor wafer 120 and insulating layer 134. FIG. 6b shows a plan view of notches 164 formed in surface 150 of semiconductor wafer 120 and insulating layer 134 around conductive layer 136 and conductive TSV 138. Notches 164 can be rectangular or circular.

Figure 6C:
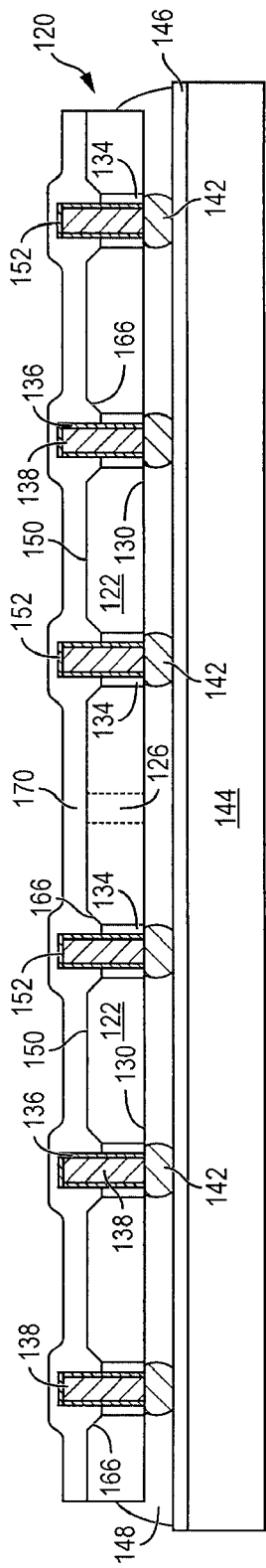

In FIG. 6c, an insulating or dielectric layer 170 is formed over surface 150 of semiconductor wafer 120, conductive layer 136, and conductive layer 152 and into notches 164 over insulating layer 134 using PVD, CVD, printing, spin coating, spray coating, sintering or thermal oxidation. The insulating layer 170 contains one or more layers of SiO2, Si3N4, SiON, Ta2O5, Al2O3, HfO2, PI, BCB, PBO, or other material having similar dielectric properties.

Figure 6D:
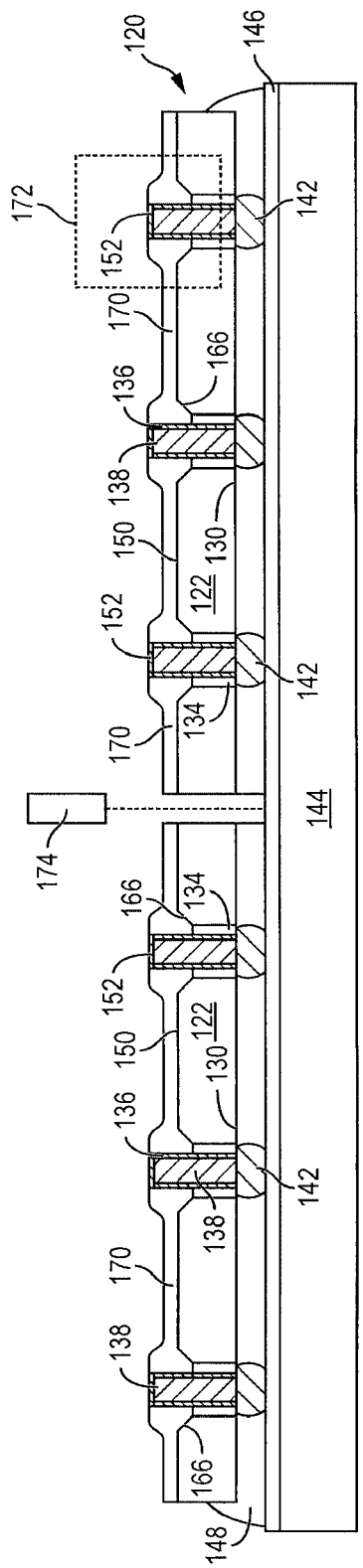
Figure 6E:
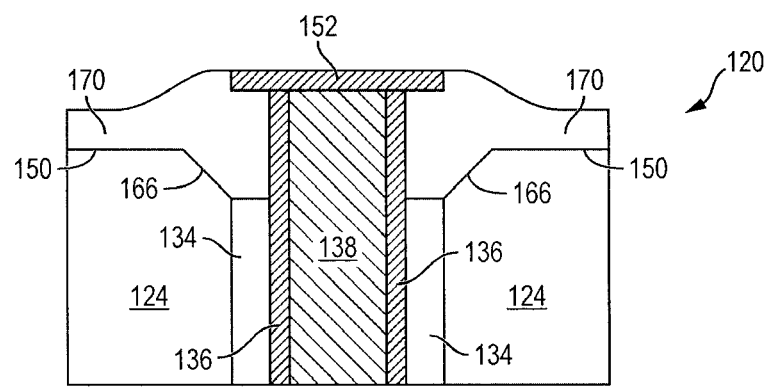

In FIG. 6d, a portion of insulating layer 170 over conductive TSV 138 is removed by CMP or etching process to expose conductive layer 152. FIG. 6e shows further detail of insulating layer 158, insulating layer 134, conductive layer 136, and conductive TSV 138 in block 172 defined in FIG. 6d.

Semiconductor wafer 120 is singulated through insulating layer 158, saw street 126, and MUF material 148 using a saw blade or laser cutting tool 174 into individual semiconductor die 124. Carrier 144 and interface layer 146 are removed by chemical etching, mechanical peeling, CMP, mechanical grinding, thermal bake, UV light, laser scanning, or wet stripping to expose bumps 142.

Figure 7:
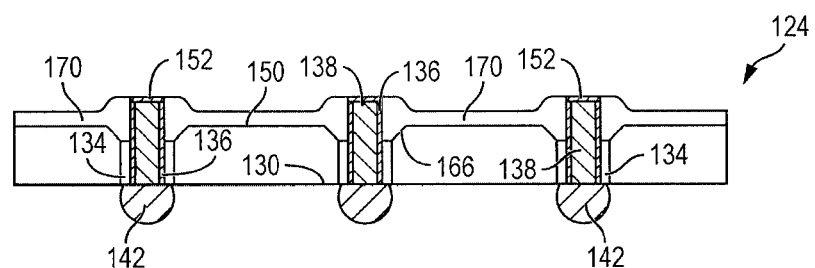
FIG. 7 illustrates a semiconductor die with an insulating layer formed in notches around conductive TSV for stress relief.

FIG. 7 shows semiconductor die 124 after singulation. The circuits on active surface 130 of semiconductor die 124 are electrically connected to conductive TSV 138 and bumps 142. Notches 164 are formed in surface 150 of semiconductor wafer 120. The insulating layer 170 is formed over surface 150, conductive layer 136, and conductive layer 152 and into notches 164 over insulating layer 134. The insulating layer 170 disposed in notches 164 provide stress relief as well as electrical isolation between conductive TSV 138 and semiconductor die 124 to reduce current leakage between the conductive TSV and semiconductor die.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die including a via formed through the semiconductor die;
   forming a first insulating layer in the via;
   forming a conductive via through the first insulating layer;
   forming a notch in the semiconductor die around the conductive via and extending into the first insulating layer;
   forming a second insulating layer over a surface of the semiconductor die and conductive via and into the notch; and
   removing a portion of the second insulating layer to expose the conductive via.

2. The method of claim 1, further including removing a first portion of the semiconductor die so the conductive via extends above the surface of the semiconductor die.

3. The method of claim 1, wherein the first insulating layer in the notch provides stress relief between the conductive via and semiconductor die.

4. The method of claim 1, further including forming the notch in the semiconductor die around the conductive via by wet etching or dry etching.

5. The method of claim 1, further including forming the notch in the semiconductor die around the conductive via by laser direct ablation.

6. A method of making a semiconductor device, comprising:
   providing a semiconductor die including a conductive via formed through the semiconductor die and extending above a surface of the semiconductor die;
   forming a notch in the semiconductor die around the conductive via; and
   forming a first insulating layer over the surface of the semiconductor die and conductive via and into the notch.

7. The method of claim 6, further including removing a portion of the first insulating layer to expose the conductive via.

8. The method of claim 6, wherein the first insulating layer in the notch provides stress relief between the conductive via and semiconductor die.

9. The method of claim 6, wherein forming the conductive via includes:
   forming a via through the semiconductor die;
   forming a second insulating layer in the via; and
   depositing a conductive material in the via.

10. The method of claim 9, further including forming the notch into the second insulating layer.

11. The method of claim 6, further including forming the notch in the semiconductor die around the conductive via by wet etching, dry etching, or laser direct ablation.

12. A semiconductor device, comprising:
    a semiconductor die;
    a conductive via formed into the semiconductor die and extending above a surface of the semiconductor die;
    a notch formed in the semiconductor die around the conductive via; and
    a first insulating layer formed over the surface of the semiconductor die and into the notch with the first insulating layer exposing the conductive via and providing stress relief between the conductive via and semiconductor die.

13. The semiconductor device of claim 12, further including a second insulating layer formed around the conductive via.

14. The semiconductor device of claim 13, wherein the notch extends into the second insulating layer.

15. The semiconductor device of claim 13, wherein the notch is rectangular or circular.

16. The semiconductor device of claim 12, further including a conductive layer formed over the conductive via.

17. A semiconductor device, comprising:
    a semiconductor die including a via formed through the semiconductor die;
    a first insulating layer formed in the via;
    a conductive via formed through the first insulating layer;
    a notch formed in the semiconductor die around the conductive via and extending into the first insulating layer; and
    a second insulating layer formed over a surface of the semiconductor die and into the notch with the second insulating layer exposing the conductive via.

18. The semiconductor device of claim 17, further including a conductive layer formed over the conductive via.

19. A semiconductor device, comprising:
    a semiconductor die including a conductive via formed through the semiconductor die and extending above a surface of the semiconductor die;
    a notch formed in the semiconductor die around the conductive via; and
    a first insulating layer formed over the surface of the semiconductor die and into the notch.

20. The semiconductor device of claim 19, wherein the first insulating layer in the notch provides stress relief between the conductive via and semiconductor die.

21. The semiconductor device of claim 19, wherein the conductive via includes:
    a via formed through the semiconductor die;
    a second insulating layer formed in the via; and
    a conductive material deposited in the via.

22. The semiconductor device of claim 21, wherein the notch extends into the second insulating layer.

* * * * *